US012740085B2

(12) United States Patent
Li et al.

(10) Patent No.: US 12,740,085 B2
(45) Date of Patent: Sep. 15, 2026

(54) METHOD FOR REDUCING DAMAGE TO FLOATING GATE POLYSILICON DURING ETCHING

(71) Applicant: Shanghai Huali Integrated Circuit Corporation, Shanghai (CN)

(72) Inventors: Cuili Li, Shanghai (CN); Shaokang Yao, Shanghai (CN); Qiwei Wang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 326 days.

(21) Appl. No.: 18/662,207

(22) Filed: May 13, 2024

(65) Prior Publication Data

US 2024/0421215 A1 Dec. 19, 2024

(30) Foreign Application Priority Data

Jun. 13, 2023 (CN) ........................ 202310699681.4

(51) Int. Cl.
*H10D 30/01* (2025.01)
*H10B 41/30* (2023.01)
*H10D 64/01* (2025.01)

(52) U.S. Cl.
CPC ....... *H10D 30/0411* (2025.01); *H10D 64/027* (2025.01); *H10B 41/30* (2023.02)

(58) Field of Classification Search
CPC .. H10B 41/30; H10D 30/0411; H10D 64/027; H10D 64/035
See application file for complete search history.

(56) References Cited

U.S. PATENT DOCUMENTS

2011/0001181 A1* 1/2011 Ju .......................... H10B 41/30 257/E27.103
2023/0320089 A1* 10/2023 Shu ........................ H10B 20/20 257/314
2023/0395729 A1* 12/2023 Barman ................. H10B 41/27

OTHER PUBLICATIONS

J. Pu et al., “Carbon-Doped Polysilicon Floating Gate for Improved Data Retention and P/E Window of Flash Memory,” in IEEE Electron Device Letters, vol. 29, No. 7, pp. 688-690, Jul. 2008.*

* cited by examiner

*Primary Examiner* — Shahan Ur Rahaman
(74) *Attorney, Agent, or Firm* — Banner & Witcoff, Ltd.

(57) ABSTRACT

The present disclosure provides a method of reducing damage to floating gate polysilicon during etching. The method includes: forming a floating gate thicker than 400 Å on a tunneling oxide layer, forming a first region including a portion of the floating gate from the bottom to the 400 Å thickness, and forming a second region including a portion of the floating gate above the 400 Å thickness; performing carbon-doping deposition into the first region of the floating gate, wherein a carbon doping process is arranged to be in gradually decreasing flow rate in a direction from the bottom of the floating gate up to the 400 Å thickness, and the second region is not subjected to carbon doping; forming a stack layer including silicon oxide, silicon nitride, and silicon oxide on the floating gate; and forming a control gate on the stack layer.

6 Claims, 2 Drawing Sheets

Step 1. Provide a tunneling oxide layer, and form a floating gate on the tunneling oxide layer, where the floating gate has a thickness greater than 400 Å, a region from the bottom to the 400 Å thickness of the floating gate is a first region, and a region above the 400 Å thickness is a second region

↓

Step 2. Perform carbon-doped deposition of the first region of the floating gate, where a carbon doping amount forms gradually decreasing grades in a vertical direction from the bottom to the 400 Å thickness of the floating gate, and the second region is subjected to no carbon doping

↓

Step 3. Form a stack layer composed of silicon oxide, silicon nitride, and silicon oxide on the floating gate

↓

Step 4. Form a control gate on the stack layer

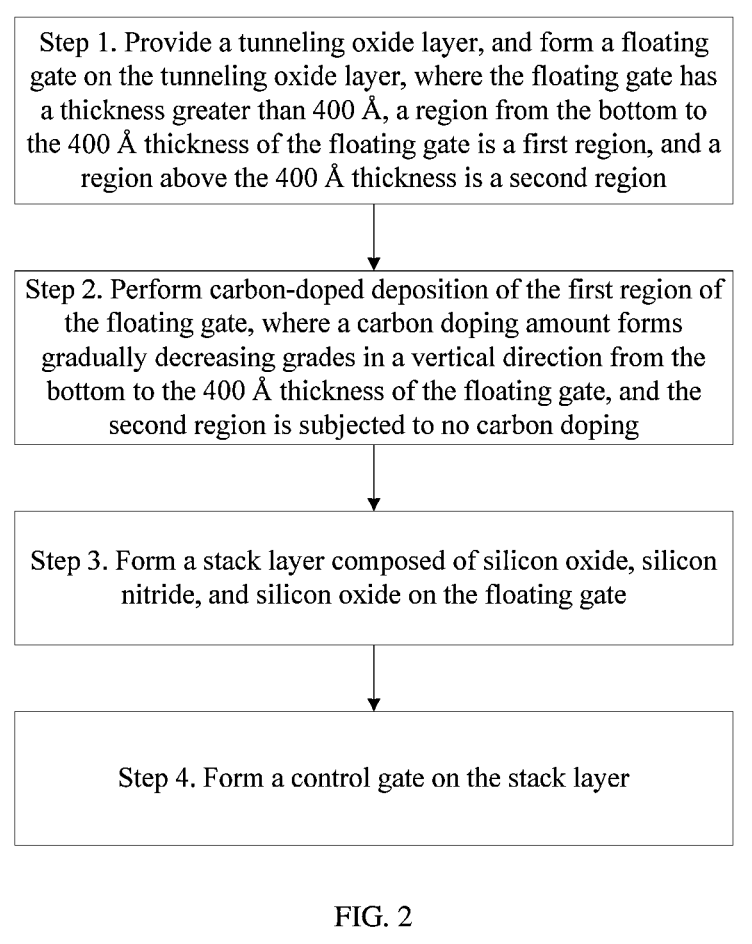

Step 1. Provide a tunneling oxide layer, and form a floating gate on the tunneling oxide layer, where the floating gate has a thickness greater than 400 Å, a region from the bottom to the 400 Å thickness of the floating gate is a first region, and a region above the 400 Å thickness is a second region

↓

Step 2. Perform carbon-doped deposition of the first region of the floating gate, where a carbon doping amount forms gradually decreasing grades in a vertical direction from the bottom to the 400 Å thickness of the floating gate, and the second region is subjected to no carbon doping

↓

Step 3. Form a stack layer composed of silicon oxide, silicon nitride, and silicon oxide on the floating gate

↓

Step 4. Form a control gate on the stack layer

FIG. 2

METHOD FOR REDUCING DAMAGE TO FLOATING GATE POLYSILICON DURING ETCHING

CROSS-REFERENCE TO RELATED APPLICATIONS

This application claims priority to Chinese patent application No. 202310699681.4, filed on Jun. 13, 2023, the disclosure of which is incorporated herein by reference in its entirety.

TECHNICAL FIELD

The present disclosure relates to the technical field of semiconductors, and in particular, to a method for reducing damage to floating gate polysilicon during etching.

BACKGROUND

In manufacturing current NAND devices, to meet the device requirements of 1×NAND devices, a step-by-step etching method is applied to etch the active region of the 1×NAND, during which an ion implantation is applied between two etching steps. The two-step etching imposes higher requirements on the stability of floating gate polysilicon. In the existing technique, the floating gate is doped with carbon at the bottom 200 Å region during deposition to increase the hardness of the floating gate, so that the floating gate has a certain degree of stability to prevent damage from the subsequent etching. After the reliability tests, a new problem has been found in samples during device failure analysis, which is the defect of shrinking waist in floating gate polysilicon. That is, the floating gate bottom has no damage, but the middle and lower portions of the floating gate are damaged during subsequent etching. How to protect the middle and lower portions of the floating gate polysilicon from subsequent etching damage has become an urgent problem to be solved.

BRIEF SUMMARY

The present disclosure provides a method for reducing damage to floating gate polysilicon during etching.

The method at least includes:

step 1, providing a tunneling oxide layer, and forming a floating gate on the tunneling oxide layer, wherein the floating gate has a thickness greater than 400 Å, and is divided into a first region from the bottom to the 400 Å thickness of the floating gate and a second region above the 400 Å thickness;

step 2, performing carbon doping deposition to the first region of the floating gate, wherein a carbon doping flow rate is arranged to be in gradually decreasing grades in a direction from the floating gate bottom up to about 400 Å thickness, carbon doping deposition, and the second region is not subjected to carbon doping;

step 3, forming a stack layer comprising silicon oxide, silicon nitride, and silicon oxide on the floating gate; and step 4, forming a control gate on the stack layer.

In an example, the floating gate in step 1 comprises polysilicon.

In an example, the floating gate in step 1 is formed by a deposition method.

In an example, during the carbon doping deposition of the first region in step 2, the carbon doping flow rate sequentially forms first to fourth grades in the direction from the bottom of the floating gate to 400 Å thickness.

In an example, the carbon doping flow rate sequentially decreases by an equal amount from the first grade to the fourth grade in step 2.

In an example, the carbon doping flow rate sequentially decreases by an equal amount from the first grade to the fourth grade in step 2.

In an example, the carbon doping flow rates of implantation of the first grade to the fourth grade in step 2 are 200 sccm (standard cubic centimeters per minute), 150 sccm, 100 sccm, and 50 sccm respectively.

As stated above, the method for reducing damage to floating gate polysilicon during etching of the preset disclosure has the following beneficial effects: The present disclosure uses a method of gradually varied carbon doping deposition of the floating gate to improve the hardness of middle and lower portions of the floating gate, improving the stability of the floating gate, protecting the floating gate from damage during subsequent etching, and thus improving the reliability of a product.

BRIEF DESCRIPTION OF THE DRAWINGS

FIG. 2 is a flow diagram of a method for reducing damage to floating gate polysilicon during etching according to the present disclosure.

DETAILED DESCRIPTION OF THE DISCLOSURE

Figure 1:
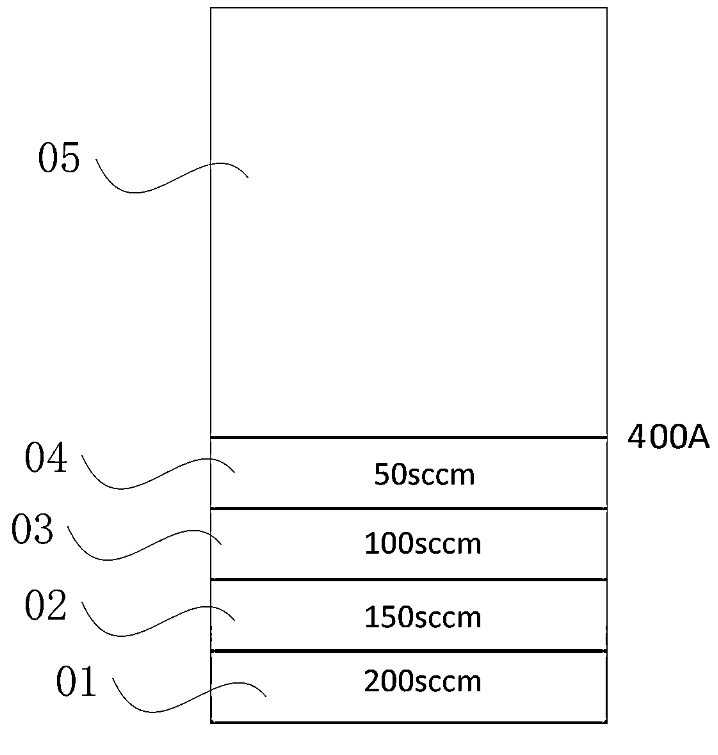
FIG. 1 is a schematic diagram of division regions and carbon doping flow rate distribution of a floating gate according to the present disclosure.

The embodiments of the present disclosure are described below using specific examples, and those skilled in the art could readily understand other advantages and effects of the present disclosure from the contents disclosed in the description. The present disclosure can also be implemented or applied using other different specific implementations, and various details in the description can also be modified or changed based on different viewpoints and disclosures without departing from the spirit of the present disclosure.

Please refer to FIGS. 1-2. It should be noted that the drawings provided in the embodiments are only used to illustrate the basic concept of the present disclosure in a schematic way, so the drawings only show the components related to the present disclosure rather than being drawn according to the number, shape, and size of the components in actual implementations. The type, number, and proportion of various components can be changed randomly in the actual implementations, and the layout of the components may be more complicated.

The present disclosure provides a method for reducing damage to floating gate polysilicon during etching. Referring to FIG. 2, FIG. 2 is a flow diagram of the method for reducing damage to floating gate polysilicon during etching according to the present disclosure. The method includes the following steps.

Step 1. Provide a tunneling oxide layer, and form a floating gate on the tunneling oxide layer, where the floating gate has a thickness greater than 400 Å, a region from the bottom of the floating gate to 400 Å thickness is a first region, and a region above the 400 Å thickness is a second region. Referring to FIG. 1, FIG. 1 is a schematic diagram of the divided regions and carbon doping flow rate distribution in the floating gate according to the present disclosure. The floating gate having a thickness greater than 400 Å in step 1 means that the thickness from the bottom to the top of the floating gate is greater than 400 Å. The region from the bottom of the floating gate to 400 Å thickness is the first region; and the region above the 400 Å thickness is the second region 05.

Furthermore, in this embodiment of the present disclosure, the floating gate in step 1 comprises polysilicon.

Furthermore, in this embodiment of the present disclosure, the floating gate in step 1 is formed by a deposition method.

Step 2. Perform carbon doping deposition of the first region of the floating gate, where a carbon doping flow rate forms gradually decreasing grades in the direction from the bottom of the floating gate to 400 Å thickness, and the second region is not subjected to carbon doping. Referring to FIG. 1, the carbon doping deposition of the first region of the floating gate is performed in step 2, where the carbon doping flow rate forms the gradually decreasing grades in the direction from the bottom of the floating gate to 400 Å thickness, and the second region 05 is not subjected to carbon doping. That is, the region above the 400 Å thickness is not subjected to carbon doping.

Furthermore, in this embodiment of the present disclosure, during the carbon doping deposition of the first region in step 2, the carbon doping flow rate sequentially forms the first to the fourth grade in the direction from the bottom to the floating gate to 400 Å thickness. The carbon doping flow rate sequentially forms the first grade 01, the second grade 02, the third grade 03, and the fourth grade 04 in the direction from the bottom of the floating gate to its 400 Å thickness, where the first grade 01 to the fourth grade 04 each has a thickness of 100 Å.

Furthermore, in this embodiment of the present disclosure, the carbon doping flow rate sequentially decreases by an equal amount from the first grade to the fourth grade in step 2.

Furthermore, in this embodiment of the present disclosure, the carbon doping flow rate sequentially decreases by 50 sccm from the first grade to the fourth grade in step 2. Referring to FIG. 1, furthermore, in this embodiment, the carbon doping flow rates of the first grade to the fourth grade in step 2 are 200 sccm, 150 sccm, 100 sccm, and 50 sccm respectively.

Step 3. Form a stack layer composed of silicon oxide, silicon nitride, and silicon oxide on the floating gate.

Step 4. Form a control gate on the stack layer.

To sum up, the present disclosure uses a method of gradually varied carbon doping deposition of the floating gate to improve the hardness of middle and lower portions of the floating gate, improving the stability of the floating gate, protecting the floating gate from damage during subsequent etching, and thus improving the reliability of a product. Therefore, the present disclosure effectively overcomes various defects in the prior art and has high industrial utilization value.

The above embodiments merely illustrate the principle and effect of the present disclosure, rather than limiting the present disclosure. Any person skilled in the art can modify or change the above embodiments without departing from the spirit and scope of the present disclosure. Therefore, all equivalent modifications or changes made by those with ordinary knowledge in the art without departing from the spirit and technical idea disclosed in the present disclosure shall still be covered by the claims of the present disclosure.

What is claimed is:

1. A method for reducing damage to floating gate polysilicon during etching, at least comprising:

step 1, providing a tunneling oxide layer, and forming a floating gate on the tunneling oxide layer, wherein the floating gate has a thickness greater than 400 Å, dividing the floating gate into a first region and a second region, wherein the first region includes a portion of the floating gate from a bottom to a 400 Å thickness, and wherein the second region includes another portion of the floating gate above the 400 Å thickness;

step 2, performing carbon doping deposition to the first region of the floating gate, wherein a carbon doping flow rate is arranged to be in gradually decreasing grades in a direction from the floating gate bottom up to about 400 Å thickness, and wherein the second region is not subjected to carbon doping, wherein during the carbon doping deposition to the first region, the carbon doping flow rate sequentially varies from a first grade to a fourth grade in a direction from the floating gate bottom up to about 400 Å thickness;

step 3, forming a stack layer comprising silicon oxide, silicon nitride, and silicon oxide on the floating gate; and step 4, forming a control gate on the stack layer.

2. The method for reducing damage to floating gate polysilicon during etching according to claim 1, wherein the floating gate in step 1 comprises polysilicon.

3. The method for reducing damage to floating gate polysilicon during etching according to claim 1, wherein the floating gate in step 1 is formed by a deposition method.

4. The method for reducing damage to floating gate polysilicon during etching according to claim 1, wherein the carbon doping flow rate sequentially decreases by an equal amount from the first grade to the fourth grade in step 2.

5. The method for reducing damage to floating gate polysilicon during etching according to claim 4, wherein the carbon doping flow rate sequentially decreases by 50 sccm per grade from the first grade to the fourth grade in step 2.

6. The method for reducing damage to floating gate polysilicon during etching according to claim 5, wherein in step 2, the carbon doping flow rate gradually decreases from the first grade to the fourth grade to be 200 sccm, 150 sccm, 100 sccm, and 50 sccm respectively.

* * * * *